United States Patent [19]
Oh

[11] Patent Number: 5,734,578
[45] Date of Patent: Mar. 31, 1998

[54] OPTICAL RF SPECTRUM ANALYZER

[75] Inventor: Tae Kwan Oh, Woodbridge, Va.

[73] Assignee: The United States of America as represented by the Secretary of the Navy, Washington, D.C.

[21] Appl. No.: 605,251

[22] Filed: Feb. 13, 1996

[51] Int. Cl.$^6$ .................................................. G01R 23/17
[52] U.S. Cl. ........................ 364/485; 356/303; 324/76.36
[58] Field of Search ..................................... 364/485, 827; 359/298; 324/76.36, 76.37; 356/300, 303

[56] References Cited

U.S. PATENT DOCUMENTS

| | | | |
|---|---|---|---|
| 5,029,253 | 7/1991 | Storti et al. | 250/484.1 |
| 5,105,380 | 4/1992 | Owechko | 364/825 |
| 5,461,475 | 10/1995 | Lerner et al. | 356/300 |
| 5,481,183 | 1/1996 | Johnson et al. | 324/76.36 |

Primary Examiner—Emanuel T. Voeltz
Assistant Examiner—Tony M. Cole
Attorney, Agent, or Firm—James B. Bechtel, Esq.

[57] ABSTRACT

An optical RF spectrum analyzer which is suitable for determining the real-time spectral frequency content of radar return signals. The optical RF spectrum analyzer includes a demodulator for demodulating an input RF signal to produce a time-varying voltage signal at its output, and a sample and hold circuit for sampling the time-varying voltage signal to obtain and hold a prescribed number of samples of the time-varying voltage signal during each of successive prescribed frame intervals. At the conclusion of each frame interval, the samples obtained and held during that frame interval are applied to respective inputs of a laser array to drive respective ones of the lasers in the array, whereby the laser array produces a spatial pattern of infrared radiation having a spatial intensity distribution which is indicative of the amplitude distribution of the envelope of the input RF signal over a given frame interval. A first optical subsystem directs the spatial pattern of infrared radiation to strike an exposed surface of the electron trapping (ET) material of a spatial light modulator (SLM). A second optical subsystem directs coherent blue light generated by an argon laser to illuminate the exposed surface of the ET material. The incident infrared radiation releases trapped electrons in the ET material at the exposed locations, resulting in the emission of incoherent visible light. The incident coherent blue light is selectively absorbed at these exposed locations as it acts to excite ground state electrons back into energy traps. The incoherent visible light which is emitted by the ET-SLM is filtered out by a blue light filter. The coherent blue light which passes through the ET-SLM is Fourier transformed by a Fourier lens, and then detected by a CCD detector. The spatial light intensity distribution of the coherent blue light detected by the CCD detector, and thus, the electrical output of the CCD detector, are indicative of the spectral intensity distribution of the input RF signal. A video display device responsive to the electrical output of the CCD detector provides a video display indicative of the spectral intensity distribution of the input RF signal.

30 Claims, 3 Drawing Sheets

OPTICAL RF SPECTRUM ANALYZER

BACKGROUND OF THE INVENTION

The present invention relates generally to RF spectrum analyzers, and more particularly, to an optical RF spectrum analzyer which is suitable for determining the real-time spectral frequency content of radar return signals, e.g., with regard to both their frequency and doppler shift characteristics.

In radars which use a conventional optical RF spectrum analzyer to determine the real-time spectral frequency content of the RF radar return signals, the RF radar return signal is heterodyned or downconverted by mixing it with a local oscillator signal (in a mixer), to thereby produce an intermediate frequency (i-f) signal which is applied to a piezoelectric transducer of an acousto-optic modulator (such as a Bragg cell) positioned in the path of a collimated coherent light beam (typically a laser beam produced by a single laser diode), to thereby modulate the intensity of the collimated coherent light beam. In this manner, the RF radar return signal is converted into a modulated light beam, which is a space-time signal. With an appropriate Fourier transform lens and a detector (e.g., a CCD detector), the spectral frequency content of the RF radar return signal can be detected, and then output as a video signal to a CRT display, oscilloscope, or other suitable video display device. Such a conventional optical RF spectrum analyzer is disclosed in U.S. Pat. No. 4,909,627, issued to Brousseau.

A conventional optical RF spectrum analyzer having expanded frequency resolution, is disclosed in U.S. Pat. No. 4,636,718, issued to Labram et al. The optical RF spectrum analyzer disclosed in this patent includes a laser source, Bragg cell, Fourier transform lens, and photo-diode array. An input RF signal is down-converted in a down-converter, the output of which is filtered, and then converted into a digital data stream by a digital-to-analog converter which resides in a signal memory which provides real-time storage of the incoming digital data stream thus produced. The signals are retrieved from the memory at a faster rate than they are inputted into the memory. The signals thus retrieved from the memory at the faster rate are then up-converted and applied to the Bragg cell to acousto-optically modulate the laser beam produced by the laser source. By this technique, time base compression of the RF input is effected, thereby providing an optical RF spectrum analyzer with expanded frequency resolution.

The conventional optical RF spectrum analyzers described above suffer from the following drawbacks and shortcomings. More particularly, the data rate and bandwidth of the conventional optical RF spectrum analyzers are limited, and because they require down conversion of the RF radar return signal, they are not particularly space-efficient.

Based on the above and foregoing, it can be appreciated that there present exists a need in the art for an optical RF spectrum analyzer which overcomes the drawbacks and shortcomings of the presently available technology. The present invention fulfills this need.

SUMMARY OF THE INVENTION

The present invention encompasses an optical RF spectrum analyzer which is suitable for determining the real-time spectral frequency content of radar return signals. The optical RF spectrum analyzer includes a demodulator for demodulating an input RF signal to produce a time-varying voltage signal at its output, a sample and hold circuit for sampling the time-varying voltage signal to obtain a prescribed number of samples of the time-varying voltage signal during each of successive prescribed frame intervals. The samples obtained during each frame interval are held for the duration of that frame interval, and, at the conclusion of that frame interval, the samples are applied over corresponding parallel output lines to respective inputs of a laser array to drive respective ones of the lasers in the array.

The laser array is preferably a micro-laser diode array. Each of the lasers in the array emits infrared light having an intensity which is proportional to the voltage level of a respective one of the samples, whereby the laser array produces a spatial pattern of infrared radiation having a spatial intensity distribution which is indicative of the amplitude distribution of the envelope of the input RF signal over a given frame interval.

A first optical subsystem directs the spatial pattern of infrared radiation to strike an exposed surface of the electron trapping (ET) material of a spatial light modulator (SLM). A second optical subsystem directs coherent light, e.g., coherent blue light, generated by a laser, e.g., an argon laser, to illuminate the exposed surface of the ET material. The ET-SLM is responsive to the spatial pattern of infrared radiation for modulating the coherent blue light. The incident infrared radiation releases trapped electrons in the ET material at the exposed locations, resulting in the emission of incoherent visible light, e.g., orange/red light. The incident coherent blue light is selectively absorbed at these exposed locations as it acts to excite ground state electrons back into energy traps. The coherent blue light which passes through the ET-SLM is a negative image of the spatial pattern of infrared radiation.

In the preferred embodiment, the incoherent visible light which is emitted by the ET-SLM is filtered out by a blue light filter. The coherent blue light which passes through the blue light filter is Fourier transformed by a Fourier lens, and then detected by an optical detection device, e.g., a CCD detector. The spatial light intensity distribution of the Fourier-transformed coherent blue light detected by the CCD detector, and thus, the electrical output of the CCD detector, are indicative of the inverse of the spectral intensity distribution of the input RF signal. It is preferable that the output of the CCD detector be inverted, so that the electrical output of the CCD detector is indicative of the spectral intensity distribution of the input RF signal, rather than the inverse thereof.

Alternatively, the coherent blue light could be filtered out and the incoherent visible light emitted by the ET-SLM could be detected. In this case, since the incoherent visible light is a positive image of the spatial pattern of infrared radiation, the output of the CCD detector need not be inverted.

A video display device, e.g., a CRT display device or oscilloscope, is utilized to provide a video display, in response to the electrical output of the CCD detector. The video display is also indicative of the spectral intensity distribution of the input RF signal.

BRIEF DESCRIPTION OF THE DRAWINGS

These and various other features and advantages of the present invention will become readily apparent with reference to the following detailed description taken in conjunction with the accompanying drawings, in which.

DETAILED DESCRIPTION OF THE INVENTION

Figure 1:
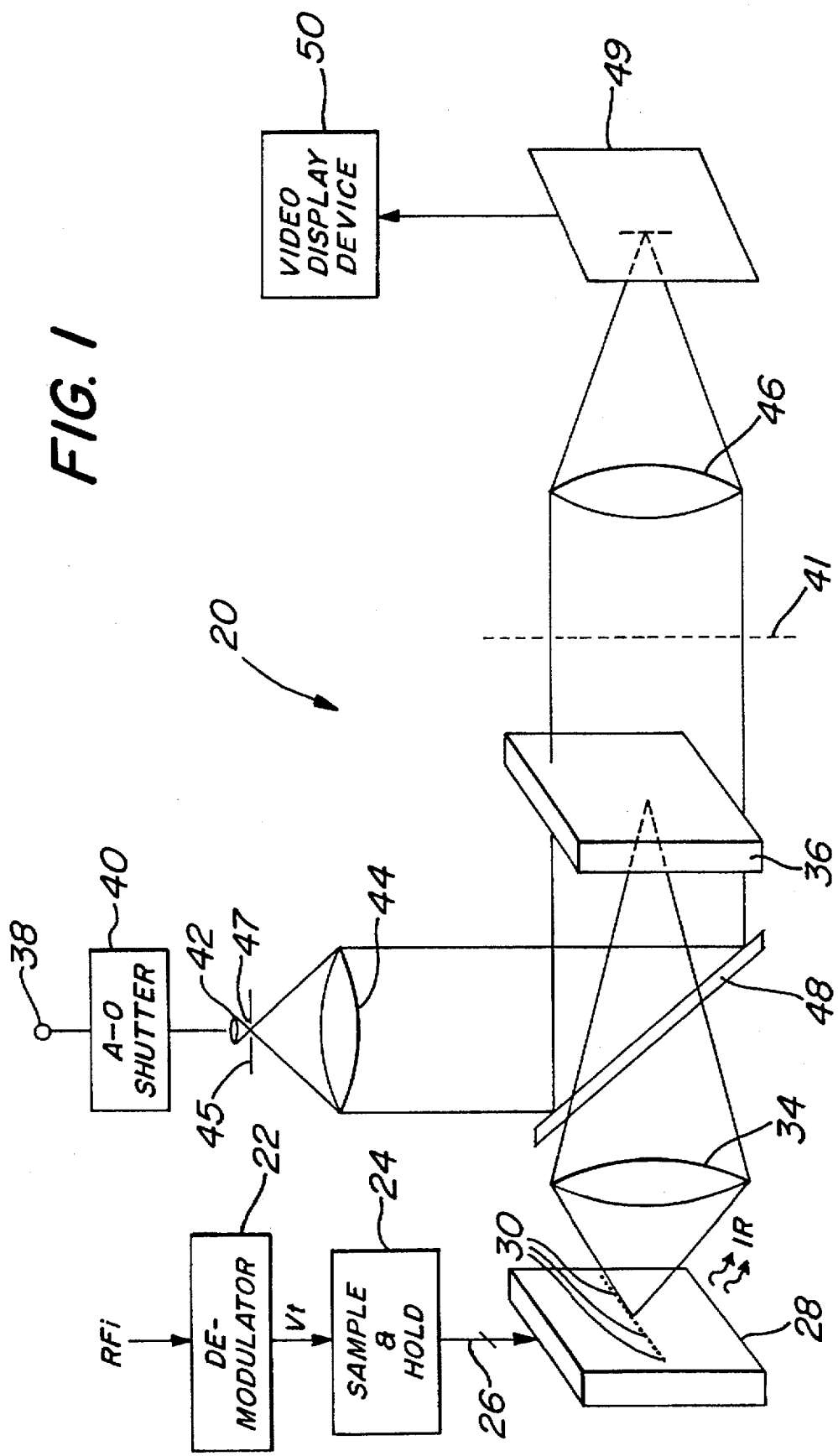
FIG. 1 is a block diagram of an optical RF spectrum analyzer constructed in accordance with a preferred embodiment of the present invention.

With reference now to FIG. 1, there can be seen a block diagram of an optical RF spectrum analyzer 20 constructed in accordance with a presently preferred embodiment of the present invention. The optical RF spectrum analyzer 20 includes a demodulator 22 which receives and demodulates an input RF signal (RFi), e.g., a radar return signal (echo), and outputs a time-varying voltage output signal Vt like that illustrated in FIG. 2. The demodulator 22 can include a down converter for downconverting the input RF signal RFi, if necessary, e.g., for input RF signals>1 GHz.

Figure 2:
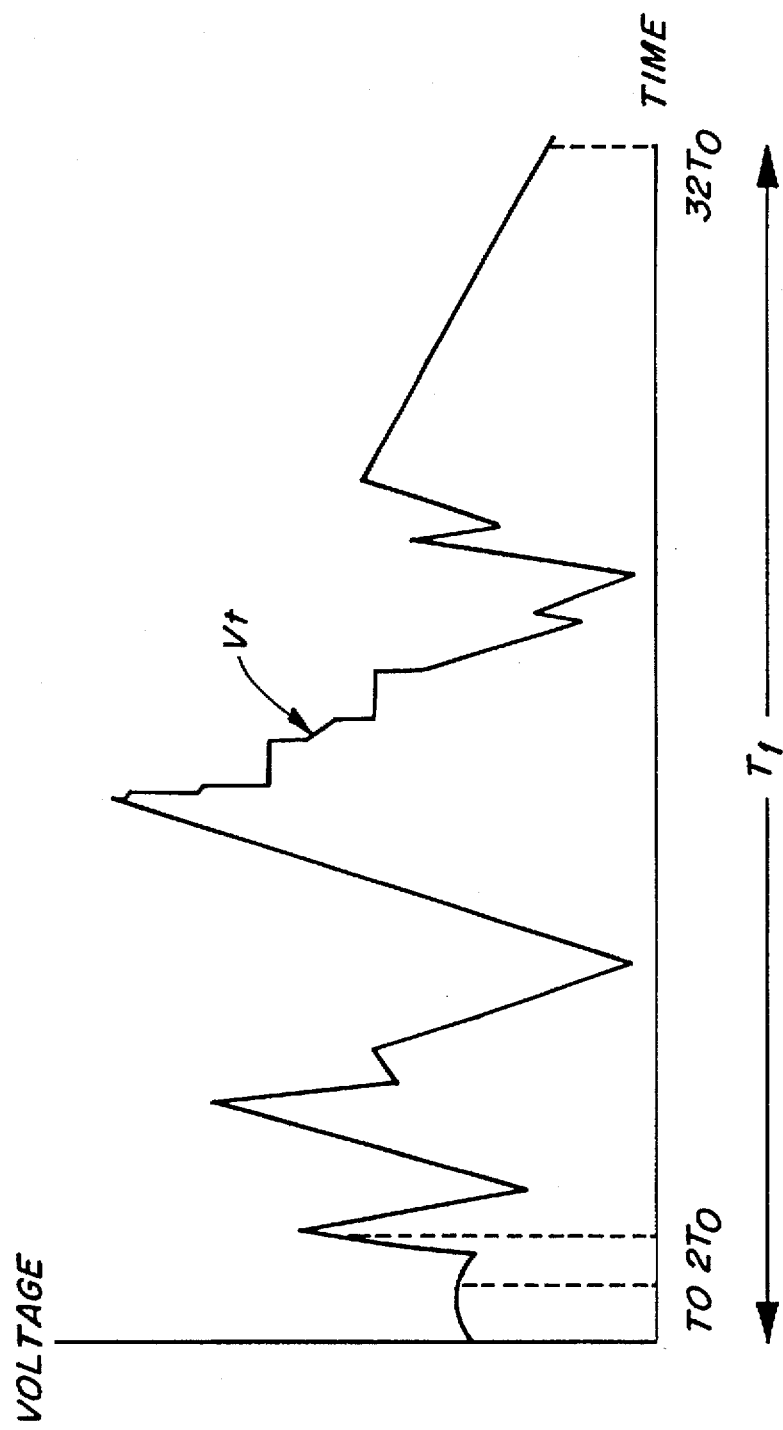
FIG. 2 is a voltage versus time diagram of the waveform of an exemplary time-varying voltage signal output by the demodulator of the optical RF spectrum analyzer depicted in FIG. 1; and, FIG. 3 is a timing diagram illustrating the different cycles of operation of the optical RF spectrum analyzer depicted in FIG. 1.

With additional reference to FIG. 2, the time-varying voltage signal Vt is applied to a sample and hold circuit 24 which samples the time-varying voltage signal Vt at a prescribed sampling rate Fs, and holds the voltage samples taken for a frame interval T1. For example, if the frame rate Ff is 235 kHz (0.235 MHz), then the frame interval T1 is 4.27 microseconds (µs). If it is desired to take 32 samples per frame interval T1, then a sample must be taken at sampling intervals T0 of 133 nanoseconds, which translates into a sampling rate Fs of 7.5 MHz. With this example, T1=32 T0. Thus, for a given frame interval T1, a first sample of the time-varying voltage signal Vt is taken at time T0, a second sample is taken at time 2T0, and so on, with the thirty-second sample being taken at time 32T0. Of course, this example and these figures are given for illustrative purposes only, and certainly are not limiting to the invention. Preferably, the sampling rate Fs is low enough to remove the carrier frequency from the input RF signal RFi without the necessity of downconverting the input RF signal RFi.

With continuing reference to FIG. 1, at the conclusion of each frame interval T1, the sample and hold circuit 24 outputs the thirty-two (or other number of) samples it has taken during that frame interval T1 over corresponding, parallel output lines 26 for application to respective inputs of a laser array 28. The laser array 28 is preferably a one-dimensional (1-D) semiconductor laser array comprised of a row or column of lasers 30 corresponding in number to the number of samples taken by the sample and hold circuit 24 during each frame interval T1. Such a 1-D laser array 28 is also referred to as a linear array. Alternatively, the laser array 28 may be a two-dimensional (2-D) array comprised of a matrix of N rows×M columns of lasers.

In the presently preferred embodiment of the present invention, the laser array 28 is a micro-laser diode array comprised of a single row (or column) of micro-laser diodes 30 which emit spatially incoherent infrared light (e.g., light having a wavelength ($\lambda$) of 850 nanometers (nm)). Most preferably, the laser array 28 is a surface-emitting (as opposed to edge-emitting) laser diode array (SELDA) manufactured by A.T&T. Alternatively, a semiconductor light emitting diode (LED) array, such as the one disclosed in U.S. Pat. No. 5,216,263, issued to Paoli, may be used in place of the laser array 28.

With continuing reference to FIG. 1, the intensity of the infrared light emitted by each laser 30 of the laser array 28 is a function of the voltage applied to the corresponding input of the laser array 28, and thus, is a function of the voltage level of the corresponding sample of the time-varying voltage signal Vt output by the sample and hold circuit 24. Accordingly, the laser array 28 emits a spatial pattern of radiation which is representative of the amplitude of the envelope of the serial input RF signal RFi over a given frame interval T1. Thus, it can be appreciated that the combination of the demodulator 22, the sample and hold circuit 24, and the laser array 28 converts the serial input RF signal RFi into a spatial pattern of infrared radiation having a spatial intensity distribution which is representative of the amplitude distribution of the envelope of the input RF signal RFi. Thus, this spatial pattern of infrared radiation can be considered to constitute an exact (or nearly exact) replica of the time-varying voltage signal Vt during the frame interval T1.

This spatial pattern of infrared radiation is focused by a focusing (converging) lens 34 onto the front surface of a spatial light modulator (SLM) 36. Preferably, the numerical aperture (N.A.) and focal length are selected so that the infrared light emitted by each micro-laser 30 is focused to a spot, so that the spatial pattern of infrared radiation which is incident on the front surface of the SLM 36 is comprised of a row of light spots corresponding in spatial location and number to the spatial location and number of micro-lasers 30 in the laser array 28.

Spatial light modulators (SLMs) are devices that modulate the phase, polarization, amplitude, and/or intensity of a one-dimensional or two-dimensional spatial light pattern as a function of space and time. SLMs can be electrically or optically driven. One class of SLMs modulates the intensity of an incident spatial light pattern by virtue of its polarization being electro-optically, magneto-optically or acousto-optically modulated. A second class of SLMs relies on the volume grating generated in photo-refractive materials. A third class of SLMs includes fast response, multiple quantum well spatial light modulators that make use of direct energy absorption in III-V compounds to modulate the amplitude of the incident spatial light pattern. Fabrication of these types of spatial light modulators is based on a sophisticated semiconductor technology, e.g., molecular beam epitaxy of alternating thin layers of III-V compounds. For a more detailed description of these and other types of spatial light modulators and multiple quantum well structures, reference may be had to A. R. Tangnay, Jr., "Materials Requirements for Optical Processing and Computing Devices", Optical Engineering, Jan./Feb. 1985, Vol. 24, No. I, pp. 2–18, which is herein incorporated by reference.

The SLM 36 employed in the practice of the present invention may be any of the above types, but most preferably, is an SLM which uses electron trapping (ET) materials, such as the ET-SLM disclosed in U.S. Pat. No. 5,029,253, issued to Storti et al., the disclosure of which is herein incorporated by reference. With this type of ET-SLM, the ET material is exposed to a pattern of modulating radiation, resulting in the excitation of electrons in the ET material at spatial locations corresponding to the pattern. When the light to be modulated (ordinarily coherent light) is simultaneously or subsequently passed through the ET material, it is absorbed in areas of the material where electrons have been excited by the modulating radiation. The unabsorbed light passes through the ET material, producing a negative image of the pattern of modulating radiation. The ET material also emits an image of incoherent visible light as the released electrons fall back to ground state. This visible light can be filtered out if the device is only being used for modulating coherent light. Conversely, the device can be utilized by detecting only the incoherent visible emission from the ET material, which constitutes a multiplicative product image of the electron exciting and electron releasing light incident on the ET material.

With reference to FIG. 1, in the presently preferred embodiment of the present invention, the light to be modulated is coherent light generated by a laser 38, e.g., an argon (Ar$^+$) laser which emits coherent blue light having a wavelength $\lambda$, of approximately 488 nanometers. As will be fully developed hereinafter, the coherent blue light issued by the laser 38 is alternately blocked and transmitted by an acousto-optic (A-O) shutter 40 of any suitable type well-known in the art. The transmitted coherent blue light is then expanded by a diverging lens 42 to preferably fill the entrance aperture of a collimating lens 44. A spatial filter (SF) 45 is preferably provided in front of the diverging lens 42, with the diverging lens 42 being closely positioned in front of the aperture 47 of the spatial filter 45. The spatial filter 45 serves to uniformly distribute the intensity of the coherent blue light.

The expanded coherent blue light is reflected from the surface of an articulated mirror 48, e.g., a partially reflective or half-silvered mirror, to illuminate the front surface of the ET-SLM 36. The ET-SLM 36 modulates the coherent blue light in accordance with the spatial pattern of infrared radiation produced by the laser array 28 in a manner described below, to thereby convert the spatially incoherent infrared light pattern to a spatially coherent blue light pattern which is a negative (inverse) image of the modulating infrared radiation. The ET material disclosed in the above-referenced U.S. Pat. No. 5,029,253 is formed of an alkaline earth metal sulfide base material, preferably strontium sulfide and/or calcium sulfide, doped with at least two rare earth impurities. The first dopant is preferably samarium or a samarium compound. The second dopant is preferably a europium compound, a cerium compound, or a combination of cerium and europium compounds.

Figure 3:
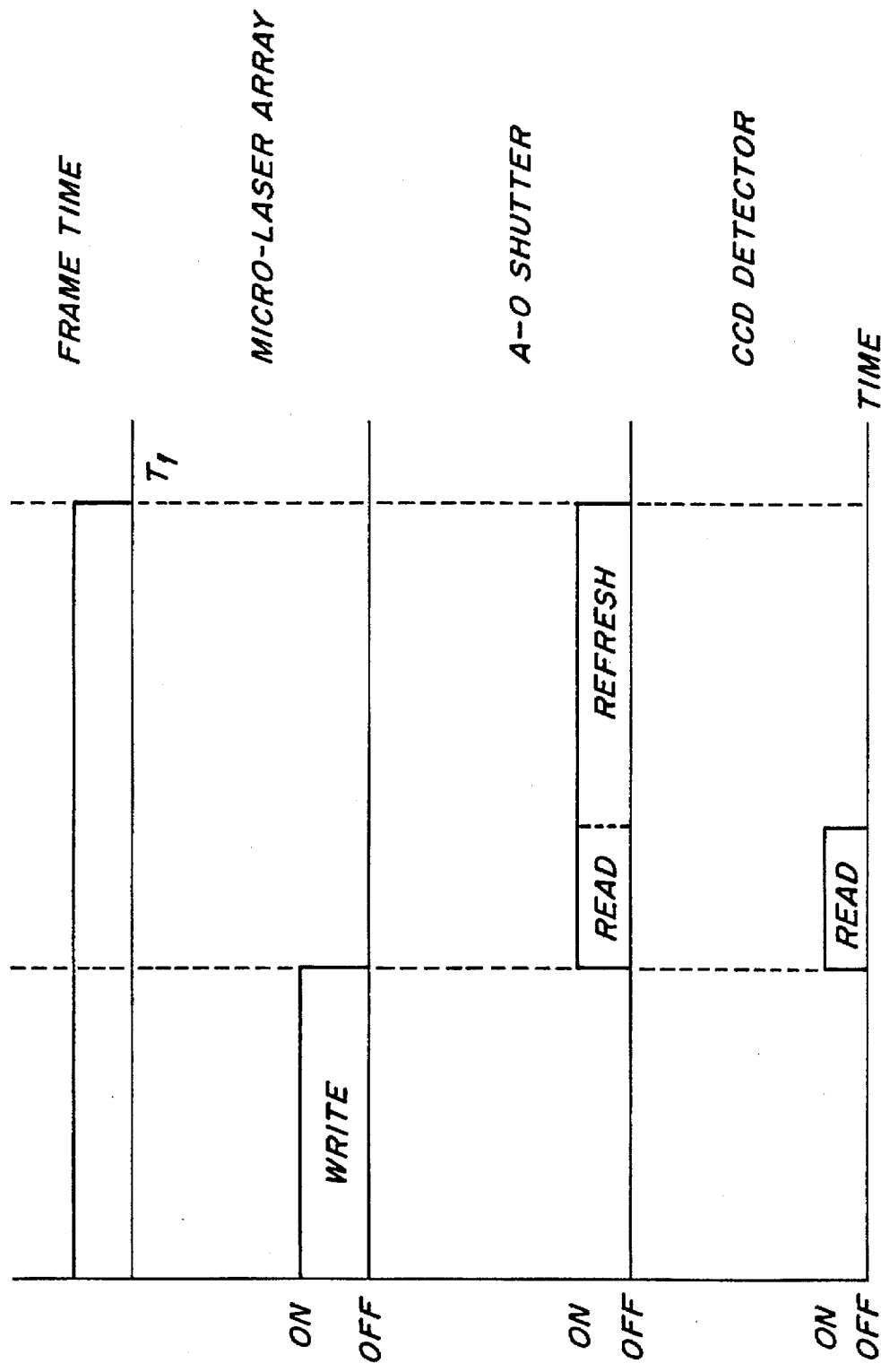

More particularly, with additional reference now to FIG. 3, during a first portion of each frame interval T1, termed the "write" cycle, the micro-laser array 28 is activated to produce the modulating infrared radiation pattern. Thus, during the write cycle, the modulating infrared radiation pattern is incident on the front surface of the ET-SLM 36. During the write cycle, the A-O shutter 40 is switched to its "off" mode, whereby it blocks the transmission of the coherent blue light from the argon laser 38. At the conclusion of the write cycle, a "read" cycle is initiated by disabling the micro-laser array 28 and switching the A-O shutter 40 to its "on" mode, whereby it transmits the coherent blue light from the argon laser 38. Thus, during the read cycle, the coherent blue light is reflected from the angled mirror 48 onto the front surface of the ET-SLM 36. During the write cycle, the infrared radiation releases trapped electrons in the ET material at the exposed locations, resulting in the emission of incoherent visible light (e.g., orange/red light). During the read cycle, the incident coherent blue light is selectively absorbed at these exposed locations as it acts to excite ground state electrons back into energy traps. Thus, the coherent blue light which passes through constitutes a negative (inverse) image of the modulating infrared radiation. Conversely, the incoherent light emitted from the ET material provides a positive multiplicative image of the incident coherent blue light and infrared radiation.

The spatial light intensity distribution of the incoherent orange/red light emitted from the ET material of the ET-SLM 36 is proportional to the spatial light intensity distribution of the spatial pattern of infrared radiation emitted by the laser array 28. Thus, the incoherent orange/red light emitted from the ET material of the ET-SLM 36 can be considered to constitute a positive (non-inverse) image (or replica) of the spatial pattern of infrared radiation (i.e., the modulating radiation) emitted by the laser array 28. Accordingly, the incoherent orange/red light emitted from the ET material of the ET-SLM 36 during the read cycle of a given frame interval T1 is representative of the amplitude distribution of the envelope of the serial input RF signal RFi during the given frame interval T1. Conversely, the coherent blue light which passes through the ET material of the ET-SLM 36 during the read cycle of a given frame interval T1 is representative of the inverse of the amplitude distribution of the envelope of the input RF signal RFi during the given frame interval T1.

Although it is possible to optically detect either the incoherent orange/red light emitted by the ET material of the ET-SLM 36 or the coherent blue light which passes through the ET material in order to determine the spectral frequency content (e.g., spectral intensity distribution) of the input RF signal RFi, in the presently preferred embodiment of the present invention, a blue light filter 41 is positioned between the ET-SLM 36 and a CCD detector 49 (or other suitable optical detection device), to thereby filter out the incoherent visible (orange/red) light, so that the CCD detector 49 only detects the coherent blue light which passes through the ET-SLM 36. However, it should be clearly understood that the present invention embraces both possibilities, i.e., optical detection of the coherent blue light or the incoherent orange/red light.

A focusing (convergent) lens 46 is interposed between the blue light filter 41 and the CCD detector 49 to image the coherent blue light which passes through the blue light filter 41 onto the face of the CCD detector 49. The lens 46 is preferably a Fourier transform lens which Fourier transforms the spatially coherent blue light to thereby convert the same into a spectral intensity distribution pattern representative of the inverse of the spectral intensity distribution of the serial input RF signal RFi during a given frame interval T1, and the CCD detector 49 is preferably positioned at the Fourier plane. The spatial light intensity distribution of the Fourier-transformed coherent blue light detected by the CCD detector 49, and thus, the electrical output of the CCD detector 49, are indicative of the inverse of the spectral intensity distribution of the input RF signal. It is preferable that the output of the CCD detector 49 be inverted, so that the electrical output of the CCD detector 49 is indicative of the spectral intensity distribution of the input RF signal, rather than the inverse thereof. Alternatively, the coherent blue light could be filtered out and the incoherent visible (orange/red) light emitted by the ET-SLM 36 could be detected by the CCD detector 49. In this case, since the incoherent visible light is a positive image of the spatial pattern of infrared radiation, the output of the CCD detector 49 need not be inverted.

In either case, the output of the CCD detector 49 is applied to any suitable video display device 50, e.g., a CRT display device or an oscilloscope. Alternatively, rather than using the Fourier lens 46 to Fourier-transform the coherent blue light (or the incoherent visible light), the output of the CCD detector 49 can be post-processed using well-known signal processing circuitry (not shown) to Fourier transform the output thereof prior to application to the video display device 50. In either case, the spectral intensity distribution of the input RF signal RFi is displayed on the screen of the video display device 50.

In this connection, the screen of the video display device 50 can be provided with a calibrated graticule to display the spectral intensity distribution of the input RF signal RFi in an easy-to-read form. For example, a calibrated vertical scale can be used to display the amplitude of each spectral component of the input RF signal RFi, and a horizontal scale can be used to display the chosen frequency band, with the spectral components of the input RF signal RFi being displayed as vertical lines whose height is proportional to amplitude and whose horizontal displacement equates to frequency.

The frequency resolution of the optical RF spectrum analyzer 20 of the present invention is dependent upon the number Np of detector elements or pixels which the CCD detector 49 is provided with in the area thereof upon which the light to be detected (i.e., either the coherent blue light or the incoherent orange/red light) is incident. More particularly, the frequency resolution Rf is given by the following equation (1):

$$Rf=BW/Np, \tag{1}$$

where BW is the bandwidth (total frequency range) of the input RF signal RFi. Thus, for an input RF signal RFi of a given bandwidth BW, the frequency resolution Rf of the spectrum analyzer 20 increases as a function of the number Np of pixels which the CCD detector 49 is provided with in the area thereof upon which the light to be detected is incident.

For example, if the input RF signal RFi has a bandwidth BW of 3.75 MHz, then the frequency resolution Rf of the spectrum analyzer 20 is approximately 29 kHz, if the light to be detected is incident upon 128 pixels of the CCD detector 49 (i.e., if Np=128), and is approximately 14.5 kHz, if the light to be detected is incident upon 256 pixels of the CCD detector 49 (i.e., if Np=256). Further, the frame rate Ff of the spectrum analyzer 20 is given by the following equation (2):

$$Ff=Fccd/Np, \tag{2}$$

where Fccd is the effective data rate of the CCD detector 49. Thus, for a CCD detector having a given frame rate Fccd, the frame rate Ff is inversely related to the number Np of pixels of the CCD detector upon which the light to be detected is incident.

For example, for a CCD detector having a frame rate Fccd of 30 MHz, the frame rate Ff is approximately 235 kHz (0.235 MHz) if Np is 128, and is approximately 117 kHz (0.117 MHz) if Np is 256. Thus, there is a performance trade-off between the processing speed and the frequency resolution of the optical RF spectrum analyzer 20 of the present invention.

In the preferred embodiment, by adding a spatial filter (not shown) at the Fourier plane, a specific characteristic of the input RF signal RFi, e.g., its doppler shift characteristic, can be detected. Of course, in the alternative embodiment, the same result can be achieved by using appropriate post-processing circuitry. Further, a low-pass filter (not shown), e.g., a spatial filter, is preferably provided before the CCD detector 49 in order to filter out unwanted noise from the light to be detected (i.e., either the coherent blue light or the incoherent visible light) which might be introduced by the various components of the system, e.g., by the laser array 28 and/or the ET-SLM 36, and spurious or extraneous noise which may be present in the input RF signal RFi itself(e.g., signal transients), or in the ambient environment of the system. Alternatively, a low-pass filter (not shown) can be provided after the CCD detector 49 as part of the interface between the CCD detector 49 and the video display device 50.

In order to minimize unwanted noise which might be introduced by the laser array 28, an adjustable bias voltage is preferably applied equally to each of the micro-laser diodes 30 of the laser array 28, and the bias voltage is preferably adjusted to raise the threshold level of the micro-laser diodes 30 above the noise floor of the input RF signal RFi. However, it should be recognized that there is a trade-off between the dynamic range of the laser array 28 and the noise level thereof. In other words, the dynamic range of the laser array 28 is inversely related to the threshold level of the micro-laser diodes 30 of the laser array 28, so that as the threshold level of the micro-laser diodes 30 is raised in order to reduce the noise level of the laser array 28, the dynamic range of the laser array 28 is lowered.

Suitable timing and sychronization circuitry (not shown) for generating the various timing and control signals required to control the operation of the sample and hold circuit 24, the laser array 28, the A-O shutter 40, and the CCD detector 49 in the described manner will be readily apparent to those skilled in the pertinent art. As such, a description of this circuitry has been omitted herein. In this connection, it is preferable that such circuitry generate control/timing signals to activate the laser array 28 at the start of each write cycle and disable the laser array 28 at the end of each write cycle, to switch the A-O shutter 40 to its "off" mode during each write cycle and switch the A-O shutter 40 to its "on" mode during each read +refresh cycle, and to activate the CCD detector 49 at the beginning of each read cycle, and to disable the CCD detector 49 at the end of each read cycle. It is preferable that the sampling and frame clocks for timing the operation of the sample and hold circuit 24 be synchronized with the data clock of the CCD detector 49.

As will be readily appreciated by those skilled in the art, because the optical RF spectrum analyzer 20 of the present invention does not require down conversion of the input RF signal, it is much more compact than presently available RF spectrum analyzers. Moreover, because of the very fast response time of the ET-SLM 36 (on the order of nanoseconds) and very fast effective data rate of the CCD detector 49, the signal processing speed (data rate) of the optical RF spectrum analyzer 20 of the present invention is significantly greater than that of the presently available RF spectrum analzyers. Further, since the serial input RF signal RFi is converted optically into a spatial light intensity distribution without using acousto-optic or electro-optic modulators and their associated drive electronics, as in presently available optical RF spectrum analyzers, the available bandwidth of the optical RF spectrum analyzer 20 is significantly greater than that of the presently available RF spectrum analyzers.

Although a presently preferred embodiment of the present invention has been described in detail hereinabove, it should be clearly understood that many variations and/or modifications of the basic inventive concepts herein taught which may appear to those skilled in the pertinent art will still fall within the spirit and scope of the present invention, as defined in the appended claims.

In this connection, the optical RF spectrum analyzer of the present invention or readily apparent adaptations thereof have utility in any radar or other system in which it is desired to analyze the spectral frequency content of an RF signal, e.g., in active radars, passive radars (radiometers), phased array radars, synthetic aperture radars, RF communications systems, multi-channel processors for phased array antennas, the front end of an image correlator for real-time terrain mapping for guidance systems for long range missiles and other precision strike weapons, the front end of an image correlator for automatic target recognition and noncooperative target recognition, doppler radars such as are used in weather surveillance, and target tracking (e.g., for tracking the flight of missiles, space vehicles, aircraft, and astronomical bodies), safety and navigations radars, search and/or tracking radars, bistatic radars, monostatic radars, secondary radars (e.g., IF radar systems), instrumentation radars, meteorological radars, earling warning radars, gunfire control radars (e.g., such as are used in radar-equipped interceptor aircraft), radar bombsights, enemy surveillance radars, and in the doppler processing portion of a ground station which processes radar return signals.

What is claimed is:

1. An optical RF spectrum analyzer, comprising:

converting means for receiving an input RF signal and converting said input RF signal into a spatial pattern of radiation having a spatial intensity distribution which is representative of the amplitude distribution of an envelope of said input RF signal;

a light source for generating a light beam;

modulating means responsive to said spatial pattern of radiation for modulating said light beam, to thereby produce an output light pattern having a spatial intensity distribution proportional to that of said spatial pattern of radiation;

transform means for Fourier transforming said output light pattern to thereby produce a Fourier-transformed output light pattern having a spectral intensity distribution representative of the spectral intensity distribution of said input RF signal; and, optical detection means for detecting said Fourier-transformed output light pattern and generating an electrical output representative of said spectral intensity distribution thereof.

2. The optical RF spectrum analyzer as set forth in claim 1, further comprising video display means responsive to said electrical output of said optical detection means for providing a video display representative of said spectral intensity distribution of said input RF signal.

3. The optical RF spectrum analyzer as set forth in claim 1, wherein said input RF signal comprises a radar return signal.

4. The optical RF spectrum analyzer as set forth in claim 2, wherein said modulating means comprises a spatial light modulator.

5. The optical RF spectrum analyzer as set forth in claims 4, wherein said light source comprises a laser, and said light beam comprises a beam of coherent light.

6. The optical RF spectrum analyzer as set forth in claim 5, wherein said beam of coherent light comprises a beam of coherent blue light.

7. The optical RF spectrum analyzer as set forth in claim 6, wherein said spatial pattern of radiation comprises a spatial pattern of infrared radiation.

8. The optical RF spectrum analyzer as set forth in claim 7, wherein said spatial light modulator includes an electron trapping material positioned to receive said spatial pattern of infrared radiation.

9. The optical RF spectrum analyzer as set forth in claim 8, further comprising a convergent lens for focusing said pattern of infrared radiation on said electron trapping material of said spatial light modulator.

10. The optical RF spectrum analyzer as set forth in claim 9, wherein said electron trapping material emits spatially incoherent light having a spatial light intensity distribution proportional to said spatial intensity distribution of said spatial pattern of infrared radiation, and passes coherent blue light which constitutes a negative image of said spatial pattern of infrared radiation, said spatially incoherent light comprising said output light pattern.

11. The optical RF spectrum analyzer as set forth in claim 10, further comprising a blue light filter positioned between said spatial light modulator and said optical detection means for filtering out said spatially incoherent light emitted by said electron trapping material of said spatial light modulator.

12. The optical RF spectrum analyzer as set forth in claim 11, wherein said transform means comprises a Fourier lens positioned between said blue light filter and said optical detection means.

13. The optical RF spectrum analyzer as set forth in claim 11, further comprising beam directing means for directing said beam of coherent blue light to impinge on said electron trapping material of said spatial light modulator.

14. The optical RF spectrum analyzer as set forth in claim 13, wherein said beam directing means comprises:

an acousto-optic shutter positioned in the path of said beam of coherent blue light, said acousto-optic shutter being operable in a first mode of operation to allow passage of said beam of coherent blue light therethrough, and operable in a second mode of operation to block passage of said beam of coherent blue light;

a diverging lens for expanding said beam of coherent blue light to thereby produce an expanded beam of coherent blue light; and, a mirror positioned in said path of said expanded beam of coherent blue light at a prescribed angle with respect thereto, for reflecting said coherent blue light onto said electron trapping material of said spatial light modulator.

15. The optical RF spectrum analyzer as set forth in claim 14, wherein said beam directing means further comprises:

a spatial filter having an aperture, said diverging lens being positioned between said acousto-optic modulator and said spatial filter, with said aperture being positioned in said path of said beam of coherent blue light proximate said diverging lens; and, a collimating lens positioned between said spatial filter and said mirror, for collimating said expanded beam of coherent blue light.

16. The optical RF spectrum analyzer as set forth in claim 15, further comprising a low-pass filter positioned between said transform means and said optical detection means.

17. The optical RF spectrum analyzer as set forth in claim 12, wherein said optical detection means comprises a CCD detector.

18. The optical RF spectrum analyzer as set forth in claim 1, wherein said converting means comprises:

a demodulator for demodulating said input RF signal to produce a time-varying voltage signal at its output;

a sample and hold circuit for sampling said time-varying voltage signal at a prescribed sampling rate during each of successive prescribed frame intervals to thereby obtain a prescribed number N of samples of said time-varying voltage signal during each said frame interval, and holding said N samples obtained during each said frame interval for the duration of that frame interval, and for outputting said N samples of said time-varying voltage signal over a corresponding number of parallel output lines at a prescribed frame rate equal to said prescribed sampling rate divided by said prescribed number N; and, a laser array for receiving said prescribed number N of samples at respective inputs thereof during each said frame interval, said laser array including a plurality of lasers coupled to corresponding ones of said inputs, wherein each of said lasers emits infrared light having an intensity which is proportional to a voltage level of a respective one of said samples.

19. The optical RF spectrum analyzer as set forth in claim 18, wherein said laser array comprises a micro-laser diode array, and said lasers comprise micro-laser diodes.

20. The optical RF spectrum analyzer as set forth in claim 19, wherein said micro-laser diode array comprises a surface-emitting micro-laser diode array.

21. The optical RF spectrum analyzer as set forth in claim 18, wherein said laser array comprises a one-dimensional laser array.

22. The optical RF spectrum analyzer as set forth in claim 18, wherein said laser array comprises a two-dimensional laser array.

23. A method for detecting the spectral content of an RF signal, comprising the steps of:

converting said RF signal into a spatial pattern of radiation having a spatial intensity distribution which is representative of the amplitude distribution of an envelope of said input RF signal;

generating a light beam;

modulating said light beam in response to said spatial pattern of radiation, to thereby produce an output light pattern having a spatial intensity distribution proportional to that of said spatial pattern of radiation;

Fourier transforming said output light pattern to thereby produce a Fourier-transformed output light pattern having a spectral intensity distribution representative of the spectral intensity distribution of said input RF signal; and, optically detecting said Fourier-transformed output light pattern and generating an electrical output representative of said spectral intensity distribution thereof.

24. The method as set forth in claim 23, further comprising the step of providing a video display representative of said spectral intensity distribution of said RF signal, in response to said electrical output.

25. The method as set forth in claim 23, wherein the step of modulating said light beam is carried out by using a spatial light modulator which includes an electron trapping material positioned to receive said spatial pattern of radiation.

26. The method as set forth in claim 25, wherein said light beam comprises a beam of coherent blue light, and said spatial pattern of radiation comprises a spatial pattern of infrared radiation produced by a laser array.

27. The method as set forth in claim 26, further comprising, before the step of Fourier transforming said output light pattern, the step of filtering out spatially incoherent light emitted by said electron trapping material of said spatial light modulator.

28. The method as set forth in claim 23, wherein the step of converting said RF signal includes the sub-steps of:

demodulating said RF signal to produce a time-varying voltage signal;

sampling said time-varying voltage signal at a prescribed sampling rate during each of successive prescribed frame intervals to thereby obtain a prescribed number N of samples of said time-varying voltage signal during each said frame interval;

holding said N samples obtained during each said frame interval for the duration of that frame interval;

outputting said N samples of said time-varying voltage signal at a prescribed frame rate equal to said prescribed sampling rate divided by said prescribed number N; and, using a laser array including a plurality of lasers coupled to corresponding ones of said samples, wherein each of said lasers emits infrared light having an intensity which is proportional to a voltage level of a respective one of said samples.

29. An optical RF spectrum analyzer, comprising:

a demodulator for demodulating an input RF signal to produce a time-varying voltage signal at its output;

a sample and hold circuit for sampling said time-varying voltage signal at a prescribed sampling rate during each of successive prescribed frame intervals to thereby obtain a prescribed number N of samples of said time-varying voltage signal during each said frame interval, and holding said N samples obtained during each said frame interval for the duration of that frame interval, and for outputting said N samples of said time-varying voltage signal over a corresponding number of parallel output lines at a prescribed frame rate equal to said prescribed sampling rate divided by said prescribed number N;

a laser array for receiving said prescribed number N of samples at respective inputs thereof during each said frame interval, said laser array including a plurality of lasers coupled to corresponding ones of said inputs, wherein each of said lasers emits infrared light having an intensity which is proportional to a voltage level of a respective one of said samples, whereby said laser array produces a spatial pattern of infrared radiation having a spatial intensity distribution which is representative of the amplitude distribution of an envelope of said RF signal over a given frame interval;

a laser for generating coherent light;

a spatial light modulator which includes an electron trapping material;

a first optical subsystem for directing said spatial pattern of infrared radiation to strike an exposed surface of said electron trapping material;

a second optical subsystem for directing said coherent light to illuminate said exposed surface of said electron trapping material;

wherein said spatial light modulator is responsive to said spatial pattern of infrared radiation for modulating said coherent light, to thereby produce an output light pattern having a spatial intensity distribution proportional to that of said spatial pattern of infrared radiation; and, an optical detection device for detecting said output light pattern and generating an electrical output representative thereof.

30. The optical RF spectrum analyzer as set forth in claim 29, further comprising:

a Fourier transform lens positioned between said spatial light modulator and said optical detection device for Fourier transforming said output light pattern before it reaches said optical detection device, whereby said output light pattern, after being Fourier-transformed by said Fourier transform lens, has a spectral intensity distribution representative of the spectral intensity distribution of said input RF signal.

* * * * *